(12) United States Patent
Lee

(10) Patent No.: US 8,294,262 B2
(45) Date of Patent: Oct. 23, 2012

(54) LED CHIP PACKAGE

(75) Inventor: Ke-Chin Lee, Taipei (TW)

(73) Assignee: Zhongshan Weiqiang Technology Co., Ltd., Zhongshan, Guangdon (CN)

( * ) Notice: Subject to any disclaimer, the term of this patent is extended or adjusted under 35 U.S.C. 154(b) by 252 days.

(21) Appl. No.: 12/588,125

(22) Filed: Oct. 6, 2009

(65) Prior Publication Data

US 2010/0181593 A1 Jul. 22, 2010

(30) Foreign Application Priority Data

Jan. 22, 2009 (TW) .............................. 98201254 U

(51) Int. Cl.
*H01L 23/34* (2006.01)
(52) U.S. Cl. .... 257/719; 257/99; 257/712; 257/E33.075
(58) Field of Classification Search .................... 257/99, 257/712, 714, 717, 719, 722, E33.075, E23.087, 257/E23.088, E23.101, E23.102
See application file for complete search history.

(56) References Cited

U.S. PATENT DOCUMENTS

| | | | | |
|---|---|---|---|---|
| 7,314,291 | B2 * | 1/2008 | Tain et al. | 362/294 |
| 7,549,773 | B2 * | 6/2009 | Lim | 362/294 |
| 7,737,462 | B2 * | 6/2010 | Oishi et al. | 257/99 |
| 2004/0159422 | A1 * | 8/2004 | Zuo et al. | 165/104.14 |
| 2007/0164427 | A1 * | 7/2007 | Sauciuc et al. | 257/714 |
| 2008/0290363 | A1 * | 11/2008 | Lin et al. | 257/99 |
| 2009/0159905 | A1 * | 6/2009 | Chen | 257/88 |

* cited by examiner

*Primary Examiner* — Eduardo A Rodela
(74) *Attorney, Agent, or Firm* — Bacon & Thomas, PLLC

(57) ABSTRACT

A LED chip package including a two-phase-flow heat transfer device, at least one LED chip, a metal lead frame and a package material. The two-phase-flow heat transfer device has at least one flat surface. The LED chip is directly or indirectly bonded or adhered to the flat surface of the two-phase-flow heat transfer device. Heat generated by the LED chip can be easily conducted away from the LED chip by the two-phase-flow heat transfer device such as a heat pipe, a vapor chamber and the like so as to prevent heat from accumulating in the LED chip thereby extending the service duration of the LED chip and to prevent the LED chip from deterioration of the light emitting performance caused by the accumulation of heat.

5 Claims, 2 Drawing Sheets

LED CHIP PACKAGE

FIELD OF THE INVENTION

This invention relates to a package of a semiconductor light emitting element, particularly to a LED chip package.

BACKGROUND OF THE INVENTION

It is well known that a LED chip is a semiconductor element having high light emitting efficiency. Recently, the LED chip is widely used in various illumination applications because the LED chip is characterized in low consumption and high luminance in comparison with the conventional lamp.

Increase in the power and the distribution density of the LED chips to meet the illumination application needing high luminance is accompanied with a problem of heat accumulation in the LED chip. If the heat generated by the LED chip cannot be effectively dissipated, the heat will accumulate in the LED chip. As a result, the illumination performance of the LED chip will be seriously affected, and even it is possible to damage the LED chip and shorten the service duration of the LED chip.

As shown in FIG. 1, it is known that a LED chip package includes a LED chip 2, a metal lead frame 4, a holder 5 and a packaging material 6. The LED chip 2 is fixed on an insulating layer 3. In order to dissipate the heat generated by the LED chip, the insulating layer 3 is in contact with a copper substrate 11 serving as a heat sink by means of bonding or adhering. The heat sink may be formed by a silicon substrate or a ceramic substrate. The heat is dissipated through the copper substrate 11.

A similar package is described in US 2006/0138621A1 wherein the heat sink is made of copper or molybdenum.

SUMMARY OF THE INVENTION

One object of this invention is to provide a LED chip package which is capable of rapidly and effectively dissipating the heat generated by the LED chip.

To achieve the above and the other objects, it is proposed that a LED chip package having a two-phase-flow heat transfer device comprises at least one LED chip bonded to at least one flat surface of the two-phase-flow heat transfer device; a metal lead frame electrically connected with the LED chip through at least one wire; a holder, holding the two-phase-flow heat transfer device, the metal lead frame and the LED chip; and a packaging material, enclosing the LED chip.

According to another aspect of this invention, the two-phase-flow heat transfer device may be a heat pipe or a vapor chamber.

According to another aspect of this invention, one end of the heat pipe has a flat end face which is thermally contacted with the LED chip.

According to another aspect of this invention, the heat pipe is bent and/or flattened.

According to another aspect of this invention, the vapor chamber is provided on a surface with at least one protrusion to be in contact with the LED chip.

The above and other objects and advantages of the present invention will become apparent from the following description with reference to the accompanying drawings which illustrate examples of the present invention.

DESCRIPTION OF PREFERRED EMBODIMENTS

The preferable embodiments of this invention are described with reference to the accompanying drawings. The embodiments which are merely preferable examples are not used to limit this invention. It is to be appreciated that the drawings are not drafted to scale.

A two-phase-flow heat transfer device typically comprises a highly vacuum enclosed space with a wick structure formed on the inner wall thereof. A small quantity of a working fluid such as water, alcohol, ammonia aqua or the mixture thereof is filled into the enclosed space. With aid of the latent heat absorbed or radiated during two-phase variation of the working fluid, the heat received by the two-phase-flow heat transfer device at one position is rapidly transferred in a great quantity to another position. In the embodiments to be explained later, the two-phase-flow heat transfer device is implemented in the form of a heat pipe or a vapor chamber.

FIG. 2 shows a LED chip package according to the first embodiment of this invention. As shown in FIG. 2, a LED chip package includes a heat pipe 1, a LED chip 2, a metal lead frame 4, a holder 5 and a packaging material 6. The LED chip 2 has an insulating layer 3. The LED chip 2 is thermally contacted with the heat pipe 1 through the insulating layer 3. Though not shown, the LED chip 2 may have no insulating layer. In such a case, the LED chip 2 is directly bonded or adhered to the heat pipe 1 and in direct thermal contact with the heat pipe 1.

The metal lead frame 4 for feeding electricity to the LED chip 2 is electrically connected with the LED chip 2 through a wire. The holder 5 holds the heat pipe 1, the metal lead frame 4 and the LED chip 2. The portion of the metal lead frame 4 passing through and extending out of the holder 5 also serves as an external electrode. The packaging material 6 is filled onto the upper surface of the holder 5 so as to enclose the LED chip 2.

The packaging material 6 may be made of epoxy resin or the other appropriate reactive resin. Preferably, the packaging material 6 includes an optical transformation material such as a fluorescent material which converts a part of the initial radiation generated by the LED chip 2 into another radiation with a wavelength different from the wavelength of the initial radiation.

Preferably, the heat pipe 1 is bent in correspondence with the internal contour of the holder 5, and the portion of the heat pipe 1 contacted with the insulating layer 3 is partially flattened so as to increase heat flux. The heat pipe 1 may be connected with the insulating layer 3 by way of bonding or adhering. For example, the contact surface of the heat pipe 1 contacted with the insulating layer 3 may be coated with silver paste so as to connect the heat pipe 1 and the insulating layer 3 together.

FIG. 3 shows a LED chip package according to the second embodiment of this invention which is a variation of the first embodiment. Similar parts are designated by like reference numerals, and description thereof may be omitted.

In comparison with the first embodiment, the heat pipe 1 in the second embodiment is further soldered with a plurality of radiation fins 13 in the vicinity of both ends.

FIG. 4 shows a LED chip package according to the third embodiment of this invention, wherein the heat pipe 1 has a flat end face 15 thermally contacted with the LED chip package 2 while the other end of the heat pipe may be thermally contacted with the other heat conducting member. For example, the other end of the heat pipe 1 formed with a spiral groove for engagement of another heat pipe is wound with an additional heat pipe (not shown) so that the other end of the heat pipe 1 is thermally contacted with the additional heat pipe. In this example, the heat pipe may not extend straight. If necessary, the heat pipe 1 may be bent into a desired configuration depending on the requirement or application.

FIG. 5 shows a LED chip package according to the fourth embodiment of this invention. The difference between this embodiment and the above mentioned embodiments resides in that in the above mentioned embodiments, the two-phase-flow heat transfer device is implemented by the form of a heat pipe, while in the fourth embodiment, the two-phase-flow heat transfer device is implemented by the form of a vapor chamber. In the embodiment as shown in FIG. 5, the vapor chamber 12 has a protrusion 14 on the upper surface thereof. The protrusion 14 is inserted into the internal contour of the holder 5 and thermally contacted with the LED chip.

FIG. 6 shows a LED chip package according to the fifth embodiment of this invention which is a variation of the fourth embodiment. The vapor chamber 12 has a plurality of protrusions 14 on the upper surface thereof, and the protrusions 14 are thermally contacted with a plurality of LED chips.

It is noted that the two-phase-flow heat transfer device may be implemented by a loop type heat pipe or a pulsating heat pipe.

While this invention has been described with reference to the embodiments, it should be understood that various changes and modifications could be made within the spirit and scope of the inventive concepts described. Accordingly, it is intended that the invention shall not be limited to the disclosed embodiments but have the full scope permitted by the language of the following claims.

A BRIEF DESCRIPTION OF THE DRAWINGS

Figure 1:
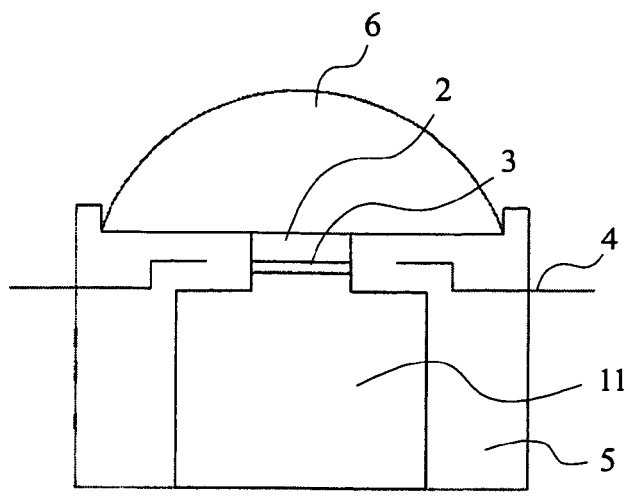
FIG. 1 shows a conventional LED chip package.
Figure 2:
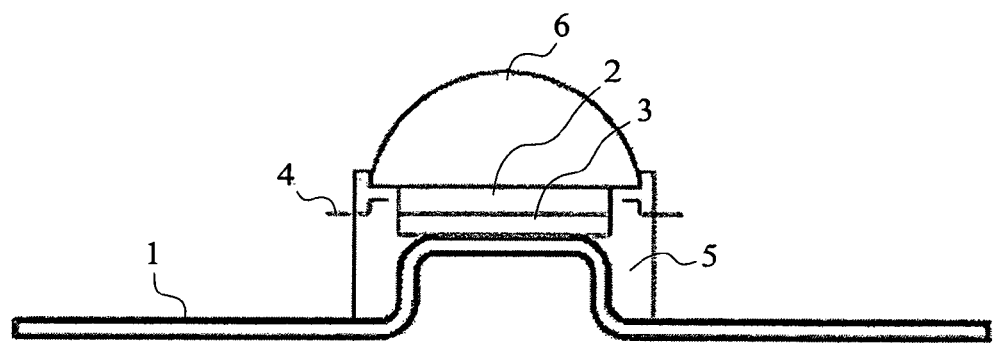
FIG. 2 shows a LED chip package according to the first embodiment of this invention.
Figure 3:
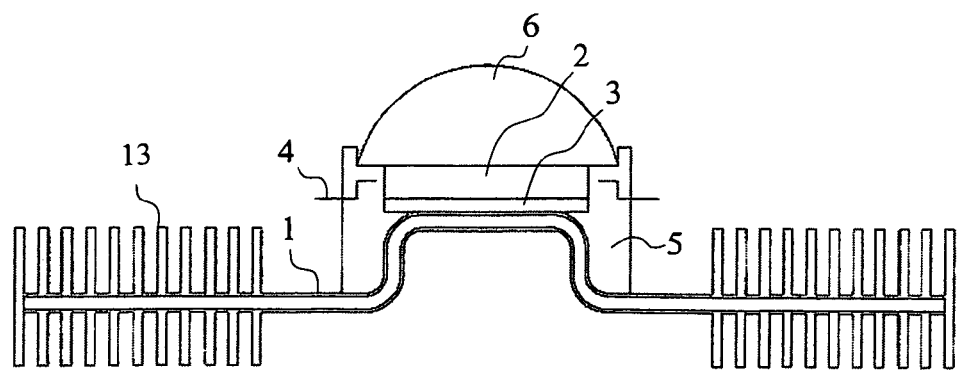
FIG. 3 shows a LED chip package according to the second embodiment of this invention, wherein the heat pipe is soldered with a plurality of radiation fins.
Figure 4:
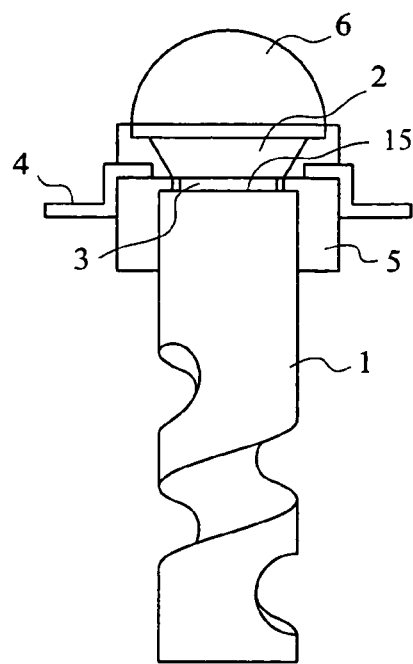
FIG. 4 shows a LED chip package according to the third embodiment of this invention, wherein the heat pipe has a flat end face contacted with the insulating layer of the LED chip package.
Figure 5:
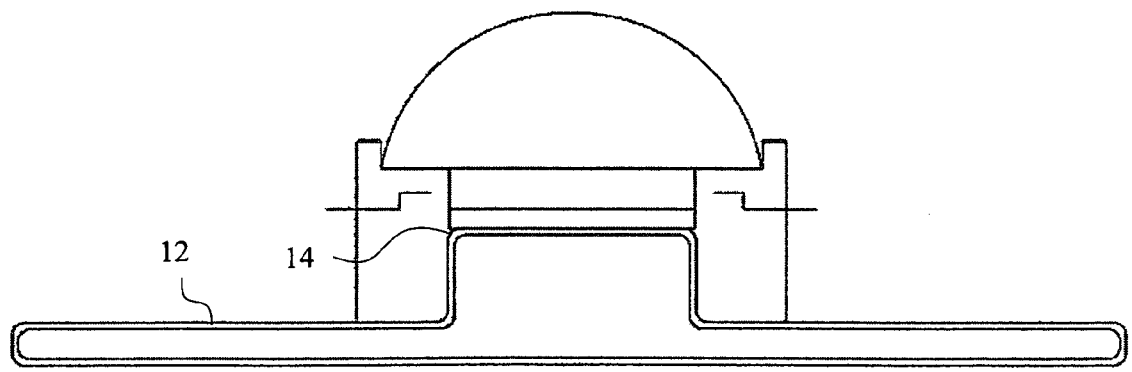
FIG. 5 shows a LED chip package according to the fourth embodiment of this invention, wherein the vapor chamber is provided on the upper surface with a protrusion contacted with the insulating layer.
Figure 6:
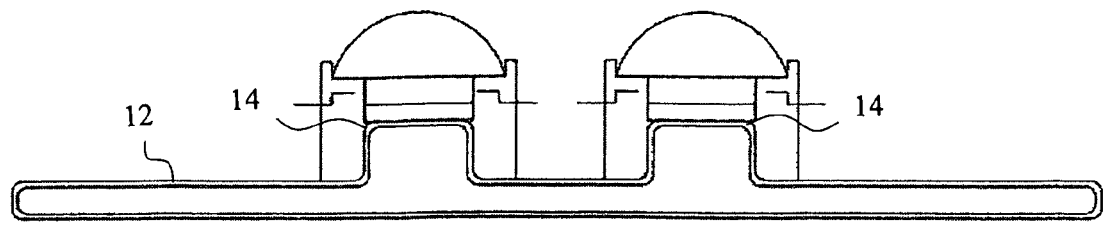
FIG. 6 shows a LED chip package according to the fifth embodiment of this invention, wherein the vapor chamber are provided on the upper surface with two protrusion.

What is claimed:

1. A LED chip package, comprising:
    a first heat pipe comprising (i) a vacuum-enclosed space with a wick structure formed on an inner wall of the vacuum-enclosed space, (ii) a flat end face; and (iii) a spiral groove formed on an outer circumference of the first heat pipe;
    a LED chip directly bonded to the flat end face of the first heat pipe;
    a metal lead frame connected with the LED chip through at least one wire;
    a holder, holding the first heat pipe, the lead frame and the LED chip;
    a packaging material for enclosing the LED chip; and
    a second heat pipe winding around the first heat pipe along the spiral groove and being in thermal contact with the first heat pipe.

2. The LED chip package of claim 1, wherein the first heat pipe is bent.

3. The LED chip package of claim 1, further comprising at least one radiation fin connecting to the first heat pipe.

4. The LED chip package of claim 1, wherein a portion of the metal lead frame passes through the holder and serves as an external electrode.

5. The LED chip package of claim 1, wherein the packaging material is filled onto an upper surface of the holder.

* * * * *